US012782390B2

(12) United States Patent
Lu et al.

(10) Patent No.: US 12,782,390 B2
(45) Date of Patent: Nov. 3, 2026

(54) PROBE CARD DEVICE HAVING PARALLEL CONNECTION CONFIGURATION AND GUIDE BOARD MECHANISM THEREOF

(71) Applicant: CHUNGHWA PRECISION TEST TECH. CO., LTD., Taoyuan City (TW)

(72) Inventors: Yu-Ju Lu, Taoyuan City (TW); Hao-Yen Cheng, Taoyuan City (TW); Rong-Yang Lai, Taoyuan City (TW); Wei-Jhih Su, Taichung City (TW)

(73) Assignee: CHUNGHWA PRECISION TEST TECH. CO., LTD., Taoyuan City (TW)

( * ) Notice: Subject to any disclaimer, the term of this patent is extended or adjusted under 35 U.S.C. 154(b) by 116 days.

(21) Appl. No.: 19/007,574

(22) Filed: Jan. 2, 2025

(65) Prior Publication Data

US 2025/0283912 A1 Sep. 11, 2025

(30) Foreign Application Priority Data

Mar. 8, 2024 (TW) ................................. 113108484

(51) Int. Cl.
*G01R 1/073* (2006.01)

(52) U.S. Cl.
CPC ................................ *G01R 1/07314* (2013.01)

(58) Field of Classification Search
None
See application file for complete search history.

(56) References Cited

U.S. PATENT DOCUMENTS

| | | | | | |
|---|---|---|---|---|---|
| 4,061,969 | A * | 12/1977 | Dean | G01R 1/07328 | 324/756.07 |
| 4,551,673 | A * | 11/1985 | Barth | G01R 31/2805 | 324/763.01 |
| 4,841,240 | A * | 6/1989 | Hsue | G01R 1/06794 | 324/763.01 |
| 4,897,598 | A * | 1/1990 | Doemens | G01R 1/07371 | 324/763.01 |
| 5,773,988 | A * | 6/1998 | Sayre | G01R 1/07328 | 324/755.05 |
| 2025/0283914 | A1* | 9/2025 | Lu | G01R 1/07342 | |
| 2025/0283915 | A1* | 9/2025 | Lu | G01R 1/07314 | |

* cited by examiner

*Primary Examiner* — Richard Isla
(74) *Attorney, Agent, or Firm* — Li & Cai Intellectual Property Office

(57) ABSTRACT

A guide board mechanism includes two guide board modules spaced apart from each other. Each of the two guide board modules includes two guide boards, a spacing sheet sandwiched between the two guide boards, and at least two connection circuits that are formed on one of the two guide boards. In each of the two guide board modules, any one of the two guide boards has a plurality of thru-holes defined as at least two thru-hole groups, and the at least two connection circuits are arranged along the at least two thru-hole groups. Moreover, patterns of the at least two connection circuits in one of the two guide board modules are respectively identical to patterns of the at least two connection circuits in another one of the two guide board modules.

9 Claims, 10 Drawing Sheets

PROBE CARD DEVICE HAVING PARALLEL CONNECTION CONFIGURATION AND GUIDE BOARD MECHANISM THEREOF

CROSS-REFERENCE TO RELATED PATENT APPLICATION

This application claims the benefit of priority to Taiwan Patent Application No. 113108484, filed on Mar. 8, 2024. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card device, and more particularly to a probe card device having a parallel connection configuration and a guide board mechanism thereof.

BACKGROUND OF THE DISCLOSURE

A conventional probe card device includes a plurality of probes and two guide board modules that are respectively assembled to two opposite ends of each of the probes, and the design of a circuit path of the conventional probe card device focuses primarily on adjustments to the structural configuration of just the probes. In other words, joint cooperation between the two guide board modules and the probes are not considered in the conventional probe card device during design of the circuit path.

SUMMARY OF THE DISCLOSURE

In response to the above-referenced technical inadequacies, the present disclosure provides a probe card device having a parallel connection configuration and a guide board mechanism thereof for effectively improving on the issues associated with conventional probe card devices.

In order to solve the above-mentioned problems, one of the technical aspects adopted by the present disclosure is to provide a probe card device having a parallel connection configuration. The probe card device includes a first guide board module, a second guide board module, and a plurality of conductive probes. The first guide board module includes two first guide boards, a first spacing sheet, and at least two first connection circuits. Each of the two first guide boards has a plurality of first thru-holes that are defined into at least two first thru-hole groups. The first spacing sheet is sandwiched between the two first guide boards along a thickness direction. The at least two first connection circuits are formed on one of the two first guide boards. The at least two first connection circuits respectively correspond in position to the at least two first thru-hole groups and are respectively arranged along the at least two first thru-hole groups. The second guide board module is spaced apart from the first guide board module along the thickness direction and includes two second guide boards, a second spacing sheet, and at least two second connection circuits. Each of the two second guide boards has a plurality of second thru-holes that are defined into at least two second thru-hole groups. The at least two first thru-hole groups respectively correspond in position to the at least two second thru-hole groups, and arrangements of the at least two first thru-hole groups are respectively identical to arrangements of the at least two second thru-hole groups. The second spacing sheet is sandwiched between the two second guide boards along the thickness direction. The at least two second connection circuits are formed on one of the two second guide boards. The at least two second connection circuits respectively correspond in position to the at least two second thru-hole groups and are respectively arranged along the at least two second thru-hole groups. The at least two first connection circuits respectively correspond in position to the at least two second connection circuits, and patterns of the at least two first connection circuits are respectively identical to patterns of the at least two second connection circuits. The conductive probes are assembled to the first guide board module and the second guide board module. The conductive probes respectively pass through the first thru-holes of each of the two first guide boards and respectively pass through the second thru-holes of each of the two second guide boards. Moreover, at least two of the conductive probes passing through one of the at least two first thru-hole groups and the corresponding second thru-hole group are electrically coupled to each other by being in contact with the corresponding first connection circuit and the corresponding second connection circuit, thereby jointly establishing a parallel connection configuration in a three-dimensional mesh shape.

In order to solve the above-mentioned problems, another one of the technical aspects adopted by the present disclosure is to provide a guide board mechanism of a probe card device having a parallel connection configuration. The guide board mechanism includes a first guide board module and a second guide board module. The first guide board module includes two first guide boards, a first spacing sheet, and at least two first connection circuits. Each of the two first guide boards has a plurality of first thru-holes that are defined into at least two first thru-hole groups. The first spacing sheet is sandwiched between the two first guide boards along a thickness direction. The at least two first connection circuits are formed on one of the two first guide boards. The at least two first connection circuits respectively correspond in position to the at least two first thru-hole groups and are respectively arranged along the at least two first thru-hole groups. The second guide board module is spaced apart from the first guide board module along the thickness direction and includes two second guide boards, a second spacing sheet, and at least two second connection circuits. Each of the two second guide boards has a plurality of second thru-holes that are defined into at least two second thru-hole groups. The at least two first thru-hole groups respectively correspond in position to the at least two second thru-hole groups, and arrangements of the at least two first thru-hole groups are respectively identical to arrangements of the at least two second thru-hole groups. The second spacing sheet is sandwiched between the two second guide boards along the thickness direction. The at least two second connection circuits are formed on one of the two second guide boards. The at least two second connection circuits respectively correspond in position to the at least two second thru-hole groups and are respectively arranged along the at least two second thru-hole groups. The at least two first connection circuits respectively correspond in position to the at least two second connection circuits, and patterns of the at least two first connection circuits are respectively identical to patterns of the at least two second connection circuits.

Therefore, the first guide board module and the second guide board module of the probe card device in the present disclosure are respectively provided with the at least two first connection circuits and the at least two second connection circuits, in which the patterns of the at least two first connection circuits are respectively identical to the patterns of the at least two second connection circuits, so that more efficient planning can be provided for a circuit path of the conductive probes for effectively increasing the performance of the probe card device and reducing a probability that components of the probe card device are damaged.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 2 is a schematic cross-sectional view taken along line II-II of

FIG. 1;

DETAILED DESCRIPTION OF THE EXEMPLARY EMBODIMENTS

Figure 1:
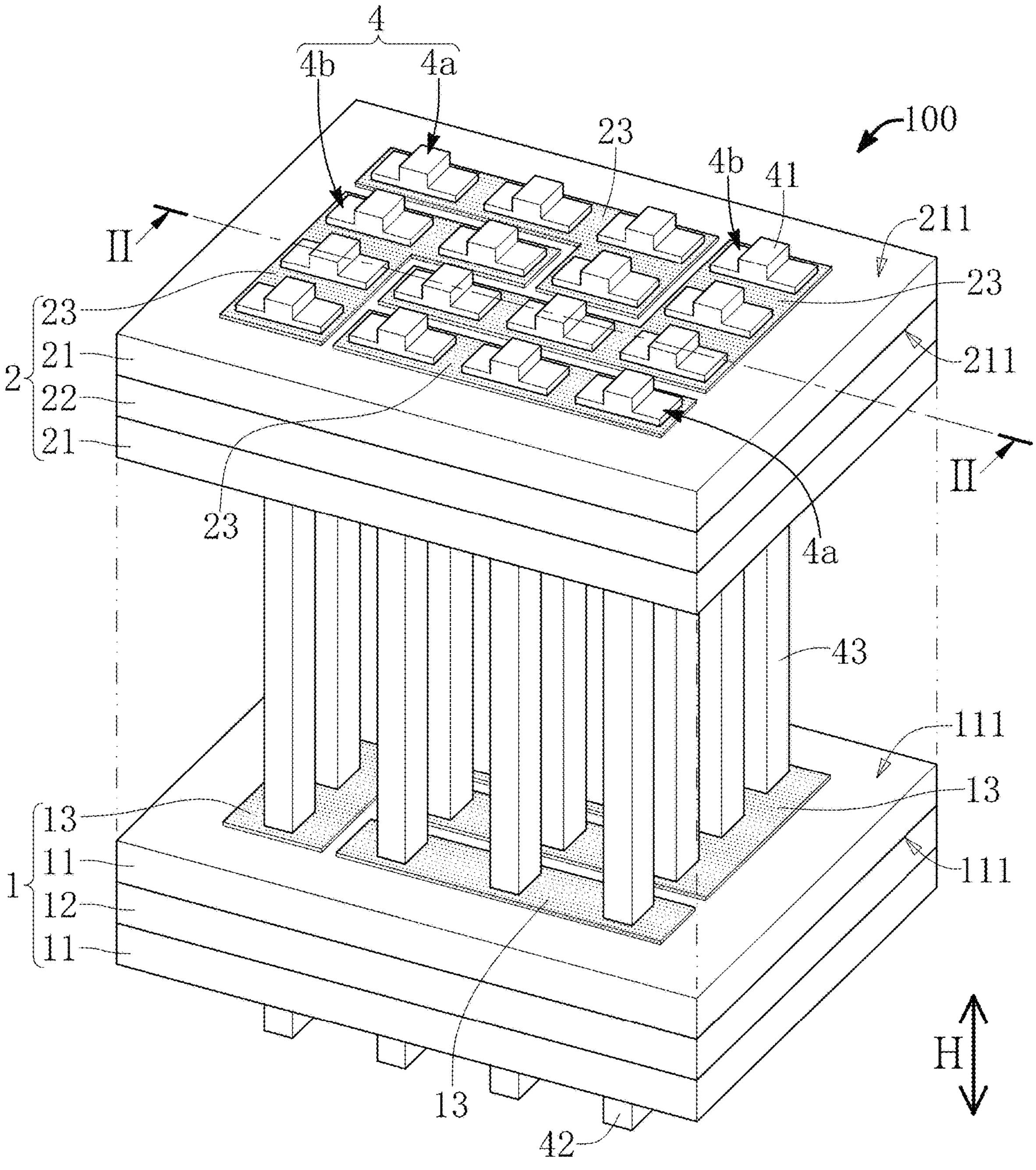
FIG. 1 is a schematic perspective view of a probe head of a probe card device having a parallel connection configuration according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
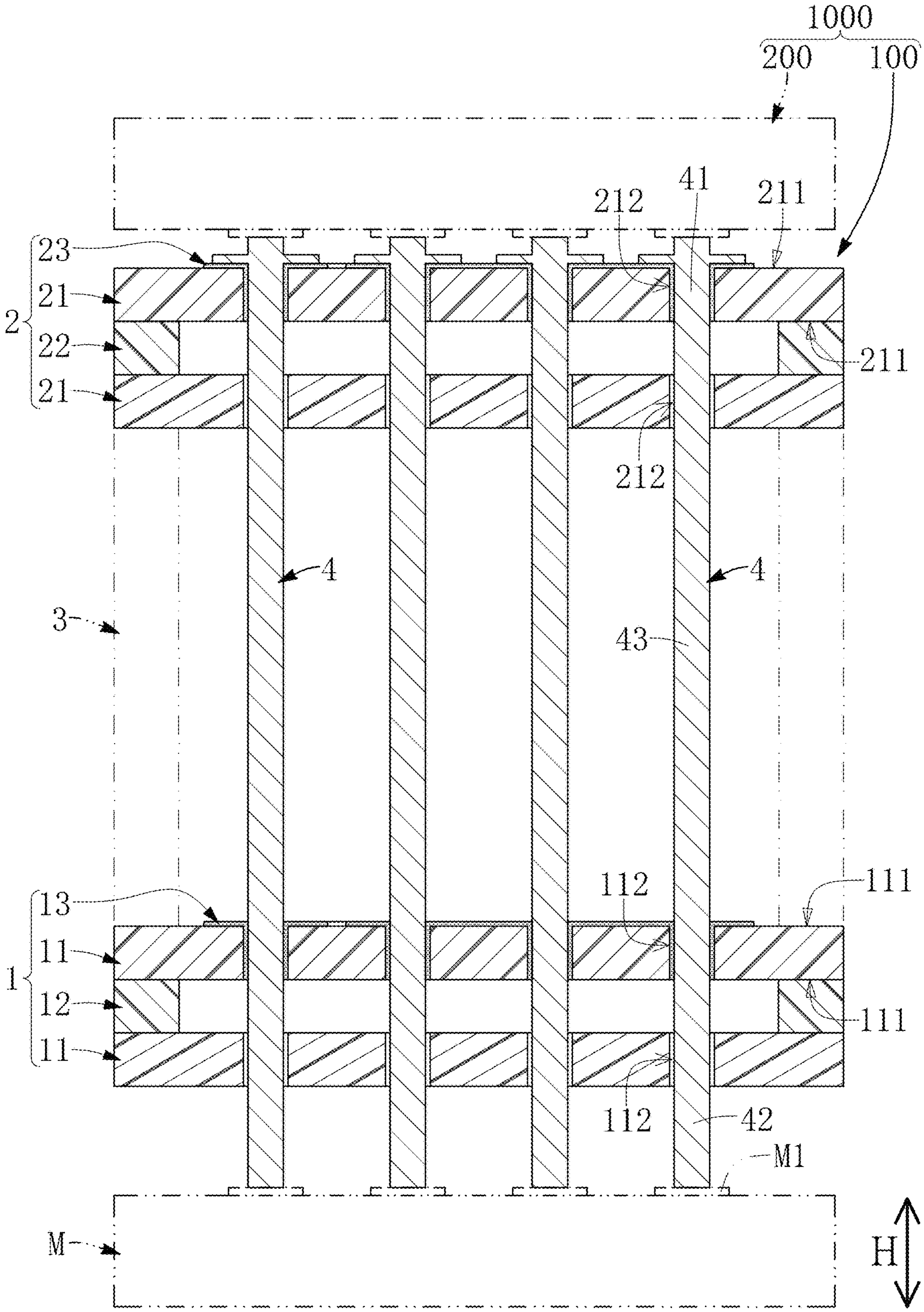
Figure 3:
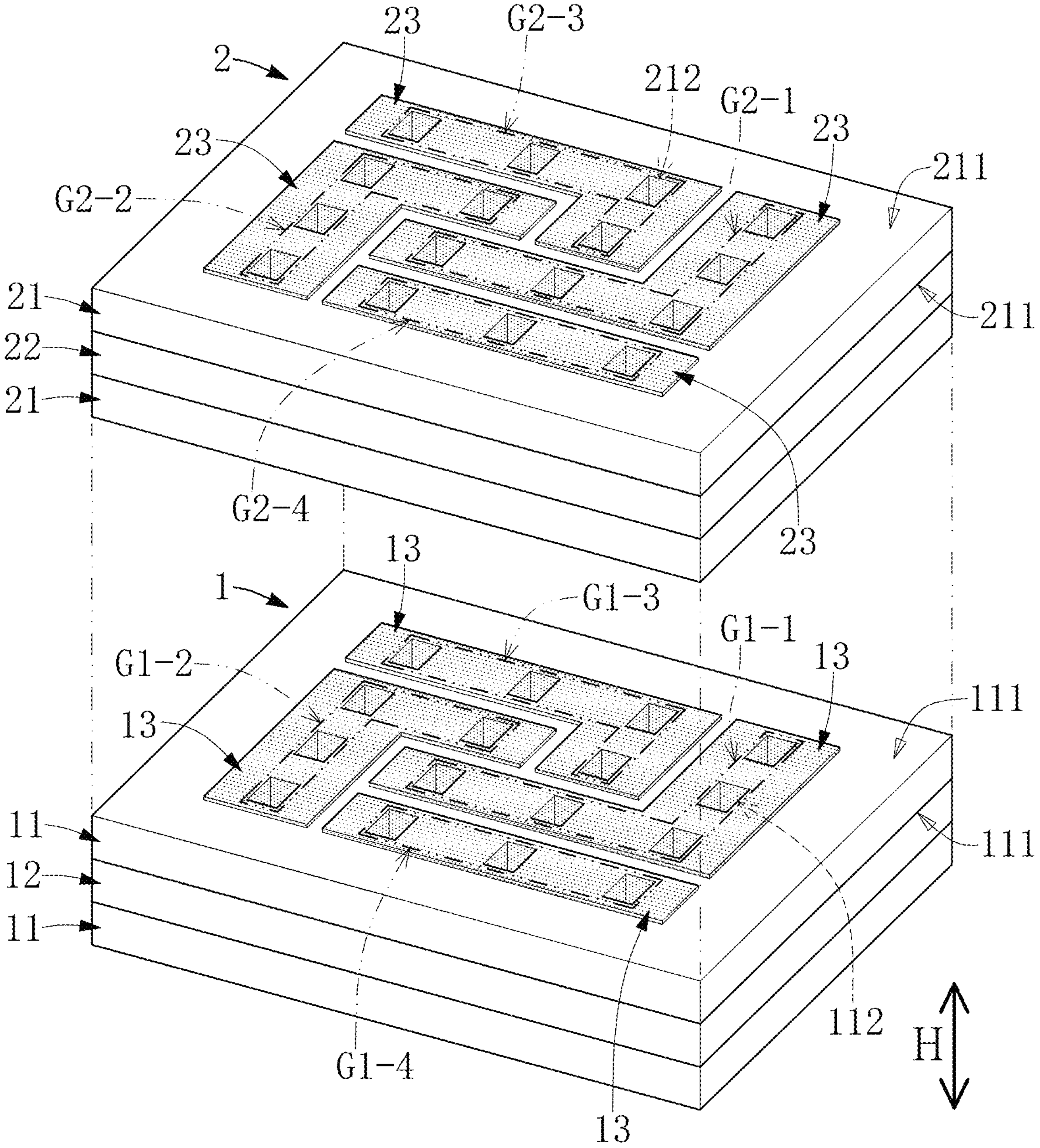
FIG. 3 is a schematic perspective view showing a guide board mechanism of FIG. 1.

Referring to FIG. 1 to FIG. 4, a first embodiment of the present disclosure is provided. As shown in FIG. 1 to FIG. 3, the present embodiment provides a probe card device 1000 having a parallel connection configuration, which includes a probe head 100 and a circuit board 200 (e.g., a space transformer) that is fixed to one side of the probe head 100. Moreover, another side of the probe head 100 is configured to detachably abut against a device under test (DUT) M for testing the DUT M.

In order to clearly describe the present embodiment, the drawings only depict a partial structure of the probe card device 1000 for clearly showing structure and connection relationship of each component of the probe card device 1000, but the present disclosure is not limited by the drawings. The following description describes the structure and connection relationship of each component of the probe card device 1000.

The probe head 100 includes a first guide board module 1, a second guide board module 2 spaced apart from the first guide board module 1 along a thickness direction H, a spacer 3 sandwiched between the first guide board module 1 and the second guide board module 2, and a plurality of conductive probes 4 that are assembled to the first guide board module 1 and the second guide board module 2. The circuit board 200 is arranged adjacent to the second guide board module 2. That is to say, the second guide board module 2 is located between the circuit board 200 and the first guide board module 1.

It should be noted that the spacer 3 can be a frame structure that is sandwiched between a peripheral portion of the first guide board module 1 and a peripheral portion of the second guide board module 2, but the present disclosure is not limited thereto. For example, in other embodiments of the present disclosure not shown in the drawings, the spacer 3 of the probe card device 1000 can be omitted or can be replaced by other components. In addition, the first guide board module 1 and the second guide board module 2 in the present embodiment are described in cooperation with the above components, but the present disclosure is not limited thereto. For example, in other embodiments of the present disclosure not shown in the drawings, the first guide board module 1 and the second guide board module 2 can be jointly defined as a guide board mechanism that is independently used (e.g., sold) or that is used in cooperation with other components. Moreover, the guide board mechanism can be provided with the spacer 3 according to practical requirements.

In the present embodiment, the first guide board module 1 includes two first guide boards 11, a first spacing sheet 12 sandwiched between the two first guide boards 11 along the thickness direction H, and at least two first connection circuits 13 that are formed on one of the two first guide boards 11. The first spacing sheet 12 is sandwiched between peripheral portions of the two first guide boards 11, the one of the two first guide boards 11 provided with the at least two first connection circuits 13 formed thereon is located closer to the second guide board module 2 than another one of the two first guide boards 11, and the at least two first connection circuits 13 are not connected to each other.

Moreover, as the two first guide boards 11 in the present embodiment are of substantially the same structure, the following description discloses the structure of the one of the two first guide boards 11 and the at least two first connection circuits 13 formed thereon for the sake of brevity, but the present disclosure is not limited thereto. For example, in other embodiments of the present disclosure not shown in the drawings, the two first guide boards 11 can be of different structures; or, each of the two first guide boards 11 can be provided with the at least two first connection circuits 13 formed thereon.

Specifically, the first guide board 11 is flat and has two first board surfaces 111 respectively arranged on two opposite sides thereof and a plurality of first thru-holes 112 that penetrate through the two first board surfaces 111 (or that penetrate therethrough). The first thru-holes 112 in the present embodiment preferably have a same size and are in a matrix arrangement, and the first thru-holes 112 are defined into four first thru-hole groups G1-1, G1-2, G1-3, G1-4, but the present disclosure is not limited thereto.

Moreover, a quantity of the at least two first connection circuits 13 in the present embodiment is four. The four first connection circuits 13 respectively correspond in position to the four first thru-hole groups G1-1, G1-2, G1-3, G1-4 and are respectively arranged along the four first thru-hole groups G1-1, G1-2, G1-3, G1-4. In other words, each of the four first connection circuits 13 is formed on a surface of the first guide board 11 along a corresponding one of the first thru-hole groups G1-1, G1-2, G1-3, G1-4 and is formed on inner walls of the corresponding first thru-holes 112, such that each of the four first connection circuits 13 abuts against and is electrically coupled to the conductive probes 4 passing through the corresponding first thru-hole group G1-1, G1-2, G1-3, G1-4.

In the present embodiment, the second guide board module 2 includes two second guide boards 21, a second spacing sheet 22 sandwiched between the two second guide boards 21 along the thickness direction H, and at least two second connection circuits 23 that are formed on one of the two second guide boards 21. The second spacing sheet 22 is sandwiched between peripheral portions of the two second guide boards 21, the one of the two second guide boards 21 provided with the at least two second connection circuits 23 formed thereon is located further away from the first guide board module 1 than another one of the two second guide boards 21, and the at least two second connection circuits 23 are not connected to each other.

Moreover, as the two second guide boards 21 in the present embodiment are of substantially the same structure, the following description discloses the structure of the one of the two second guide boards 21 and the at least two second connection circuits 23 formed thereon for the sake of brevity, but the present disclosure is not limited thereto. For example, in other embodiments of the present disclosure not shown in the drawings, the two second guide boards 21 can be of different structures; or, each of the two second guide boards 21 can be provided with the at least two second connection circuits 23 formed thereon.

Specifically, the second guide board 21 is flat and has two second board surfaces 211 respectively arranged on two opposite sides thereof and a plurality of second thru-holes 212 that penetrate through the two second board surfaces 211 (or that penetrate therethrough). The second thru-holes 212 in the present embodiment preferably have a same size and are in a matrix arrangement, and the second thru-holes 212 are defined into four second thru-hole groups G2-1, G2-2, G2-3, G2-4, but the present disclosure is not limited thereto.

Moreover, a quantity of the at least two second connection circuits 23 in the present embodiment is four. The four second connection circuits 23 respectively correspond in position to the four second thru-hole groups G2-1, G2-2, G2-3, G2-4 and are respectively arranged along the four second thru-hole groups G2-1, G2-2, G2-3, G2-4. In other words, each of the four second connection circuits 23 is formed on a surface of the second guide board 21 along the corresponding second thru-hole group G2-1, G2-2, G2-3, G2-4 and is formed on inner walls of the corresponding second thru-holes 212, such that each of the four second connection circuits 23 abuts against and is electrically coupled to the conductive probes 4 passing through a corresponding one of the second thru-hole groups G2-1, G2-2, G2-3, G2-4.

It should be noted that, the four first connection circuits 13 respectively correspond in position to the four second connection circuits 23 along the thickness direction H, and patterns of the four first connection circuits 13 are respectively identical to patterns of the four second connection circuits 23. In other words, the four first thru-hole groups G1-1, G1-2, G1-3, G1-4 respectively correspond in position to the four second thru-hole groups G2-1, G2-2, G2-3, G2-4, and arrangements of the four first thru-hole groups G1-1, G1-2, G1-3, G1-4 are respectively identical to arrangements of the four second thru-hole groups G2-1, G2-2, G2-3, G2-4. (i.e., the second thru-holes 212 of each of the two second guide boards 21 respectively correspond in position to the first thru-holes 112 of any one of the two first guide boards 11 along the thickness direction H).

The conductive probes 4 respectively pass through the first thru-holes 112 of each of the two first guide boards 11 and respectively pass through the second thru-holes 212 of each of the two second guide boards 21. Accordingly, in practical use, each of the conductive probes 4 can be positioned and held through a staggered arrangement of the first guide board module 1 and the second guide board module 2.

Specifically, each of the conductive probes 4 has a fixing segment 41, a testing segment 42 being opposite to the fixing segment 41, and an extending segment 43 that connects the fixing segment 41 and the testing segment 42. In each of the conductive probes 4, the fixing segment 41 protrudes from (or passes through) the second guide board module 2 and is fixed to the circuit board 200, and the testing segment 42 protrudes from (or passes through) the first guide board module 1 and is configured to detachably abut against one of metal pads M1 of DUT M.

Moreover, in practical use (not shown in the drawings), the testing segment 42 of each of the conductive probes 4 can be positioned and held through a staggered arrangement of the two first guide boards 11, the fixing segment 41 of each of the conductive probes 4 can be positioned and held through a staggered arrangement of the two second guide boards 21, and the extending segment 43 of each of the conductive probes 4 is elastically deformed due to the staggered arrangement of the first guide board module 1 and the second guide board module 2, but the present disclosure is not limited thereto.

In summary, at least two of the conductive probes 4 passing through one of the four first thru-hole groups G1-1, G1-2, G1-3, G1-4 and the corresponding second thru-hole group G2-1, G2-2, G2-3, G2-4 are electrically coupled to each other by being in contact with the corresponding first connection circuit 13 and the corresponding second connection circuit 23, thereby jointly establishing a parallel connection configuration in a three-dimensional mesh shape.

In the present embodiment, the conductive probes 4 in the present embodiment are of substantially the same structure and include a plurality of grounding probes 4*a* and a plurality of power probes 4*b*. The grounding probes 4*a* pass through two of the four first thru-hole groups G1-3, G1-4 and the corresponding two second thru-hole groups G2-3, G2-4, such that the grounding probes 4*a* are respectively connected to two of the four first connection circuits 13 and are respectively connected to two of the four second connection circuits 23. Moreover, the power probes 4*b* pass through another two of the four first thru-hole groups G1-1, G1-2 and the corresponding two second thru-hole groups G2-1, G2-2, such that the power probes 4*b* are respectively connected to another two of the four first connection circuits 13 and are respectively connected to another two of the four second connection circuits 23.

Accordingly, the grounding probes 4*a* passing through any one of the two corresponding first thru-hole groups G1-3, G1-4 and the corresponding second thru-hole groups G2-3, G2-4 are electrically coupled to each other through the corresponding first connection circuit 13 and the corresponding second connection circuit 23, and the power probes 4*b* passing through any one of the two corresponding first thru-hole groups G1-1, G1-2 and the corresponding second thru-hole groups G2-1, G2-2 are electrically coupled to each other through the corresponding first connection circuit 13 and the corresponding second connection circuit 23, thereby establishing the parallel connection configuration and effectively enabling a current to uniformly travel therethrough.

The two of the four first thru-hole groups G1-3, G1-4 (or the two of the four second thru-hole groups G2-3, G2-4) corresponding to the grounding probes 4*a* are respectively arranged at two opposite sides of the another two of the four first thru-hole groups G1-1, G1-2 (or the two of the four second thru-hole groups G2-1, G2-2) corresponding to the power probes 4*b*, thereby providing a shielding effect.

Figure 4:
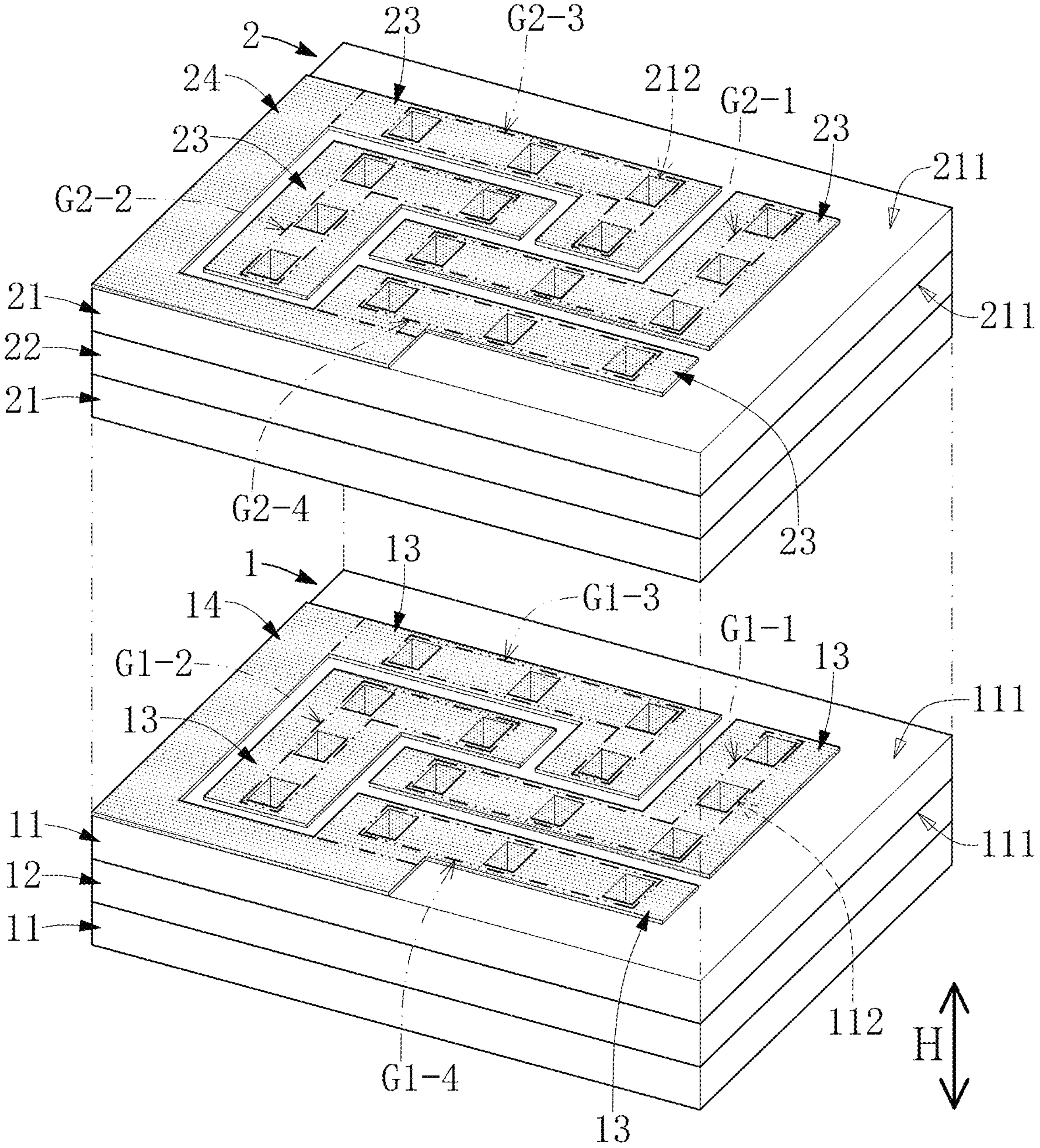
FIG. 4 is a schematic exploded view showing the guide board mechanism of FIG. 1 in another configuration.

In addition, as shown in FIG. 4, the first guide board module 1 can further include a first bridging circuit 14, and the two of the four first connection circuits 13 connected to the grounding probes 4*a* are electrically coupled to each other through the first bridging circuit 14. Moreover, the second guide board module 2 can further include a second bridging circuit 24, and the two of the four second connection circuits 23 connected to the grounding probes 4*a* are electrically coupled to each other through the second bridging circuit 24. Accordingly, the grounding probes 4*a*, the two of the four first connection circuits 13, the first bridging circuit 14, the two of the four second connection circuits 23, and the second bridging circuit 24 are electrically coupled to each other for jointly forming a complete grounding and shielding structure.

Second Embodiment

Figure 5:
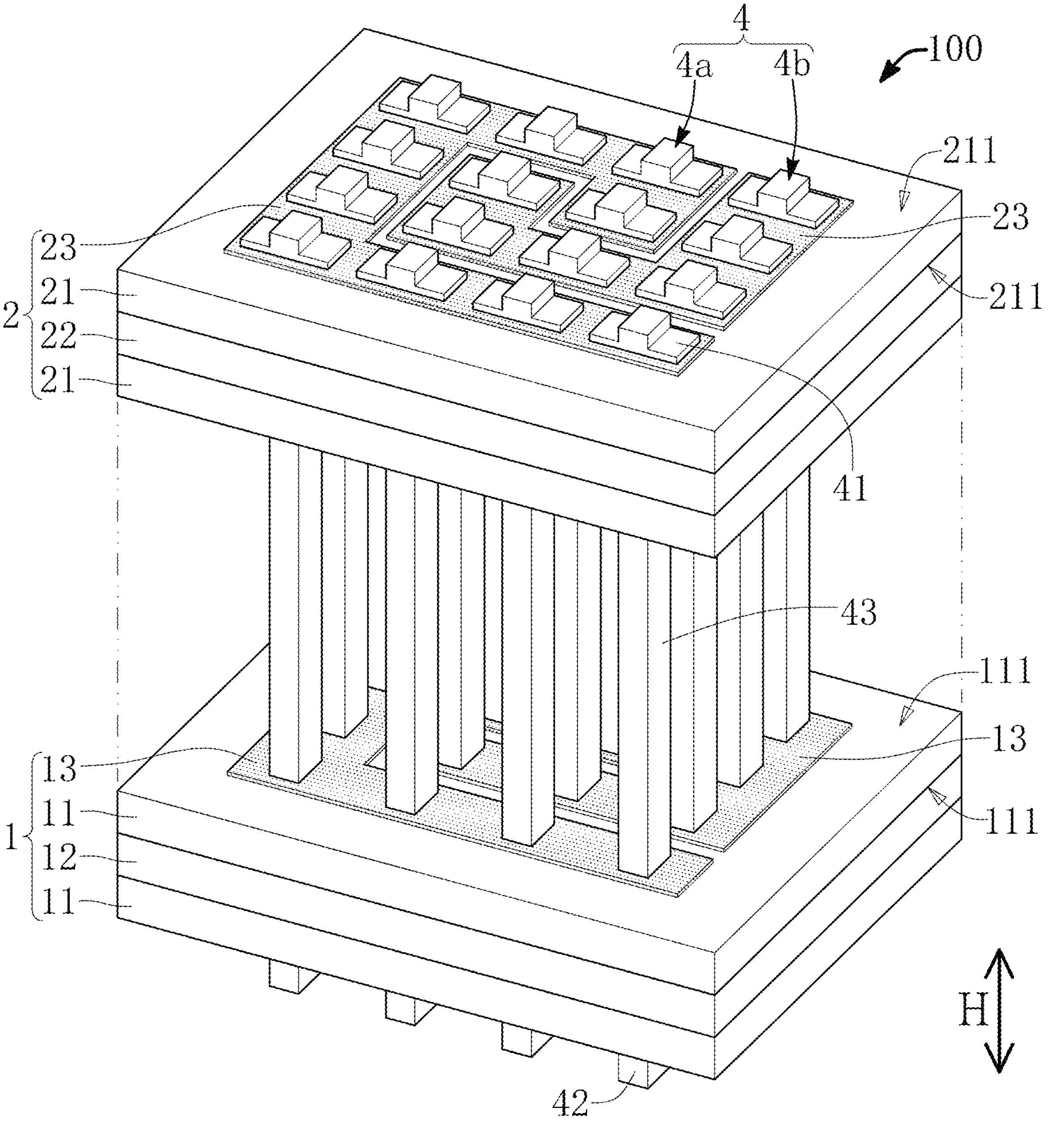
FIG. 5 is a schematic perspective view of the probe head of the probe card device according to a second embodiment of the present disclosure.
Figure 6:
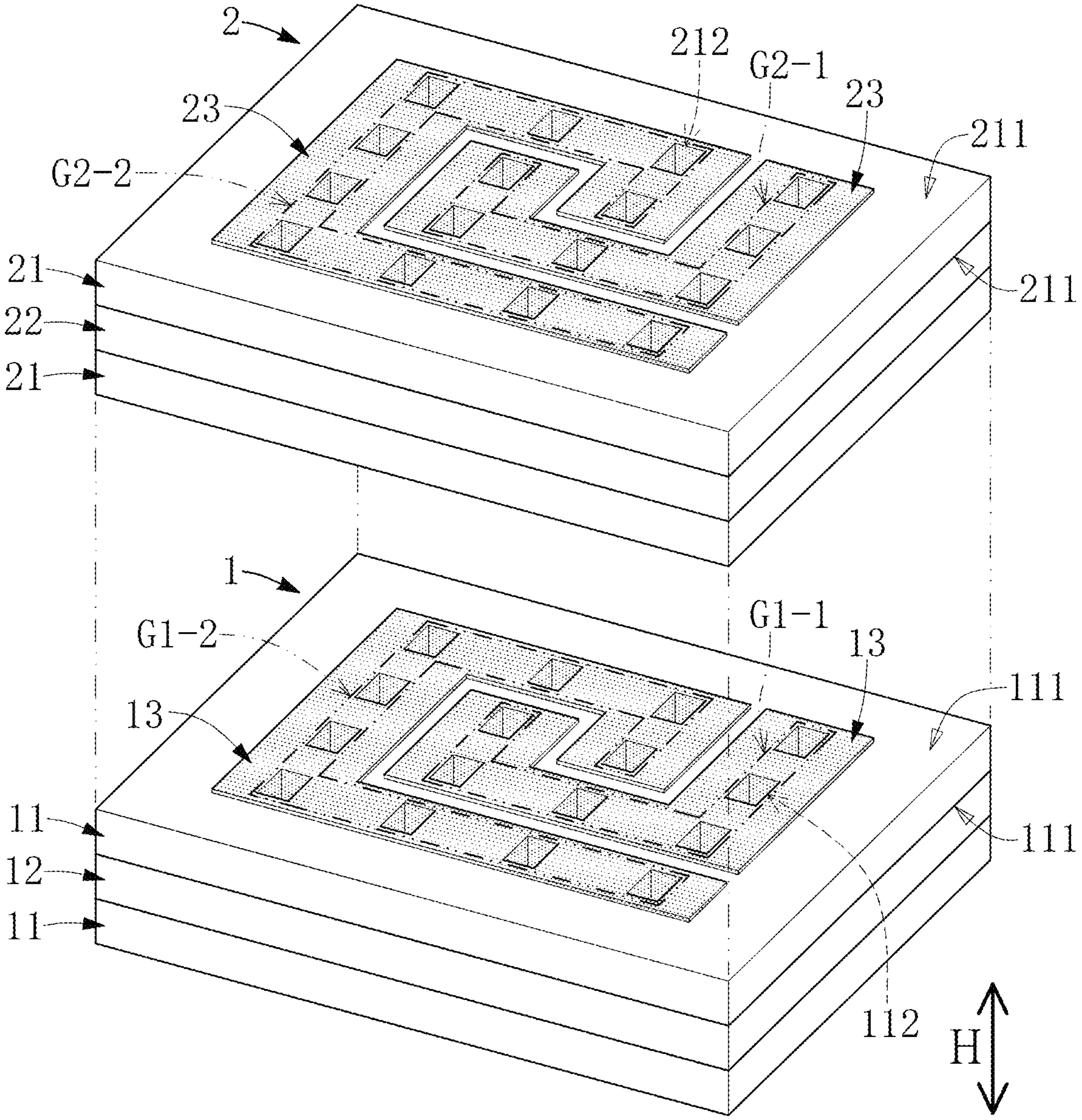
FIG. 6 is a schematic perspective view showing the guide board mechanism of FIG. 5.

Referring to FIG. 5 and FIG. 6, a second embodiment of the present disclosure, which is similar to the first embodiment of the present disclosure, is provided. For the sake of brevity, descriptions of the same components in the first and second embodiments of the present disclosure will be omitted herein, and the following description only discloses different features between the first and second embodiments.

In the present embodiment, the first thru-holes 112 of each of the two first guide boards 11 are defined into two first thru-hole groups G1-1, G1-2, and the second thru-holes 212 of each of the two second guide boards 21 are defined into two second thru-hole groups G2-1, G2-2. Moreover, the first connection circuits 13 and the second connection circuits 23 are each two in quantity. The two first connection circuits 13 are not connected to each other, the two second connection circuits 23 are not connected to each other, and the guide board mechanism in the present embodiment is provided without any bridging circuit.

Specifically, the grounding probes 4*a* pass through one of the two first thru-hole groups G1-2 and the corresponding second thru-hole group G2-2, such that the grounding probes 4*a* are connected to one of the two first connection circuits 13 and are connected to one of the two second connection circuits 23. The power probes 4*b* pass through another one of the two first thru-hole groups G1-1 and the corresponding second thru-hole group G2-1, such that the power probes 4*b* are connected to another one of the two first connection circuits 13 and are connected to another one of the two second connection circuits 23.

Third Embodiment

Figure 7:
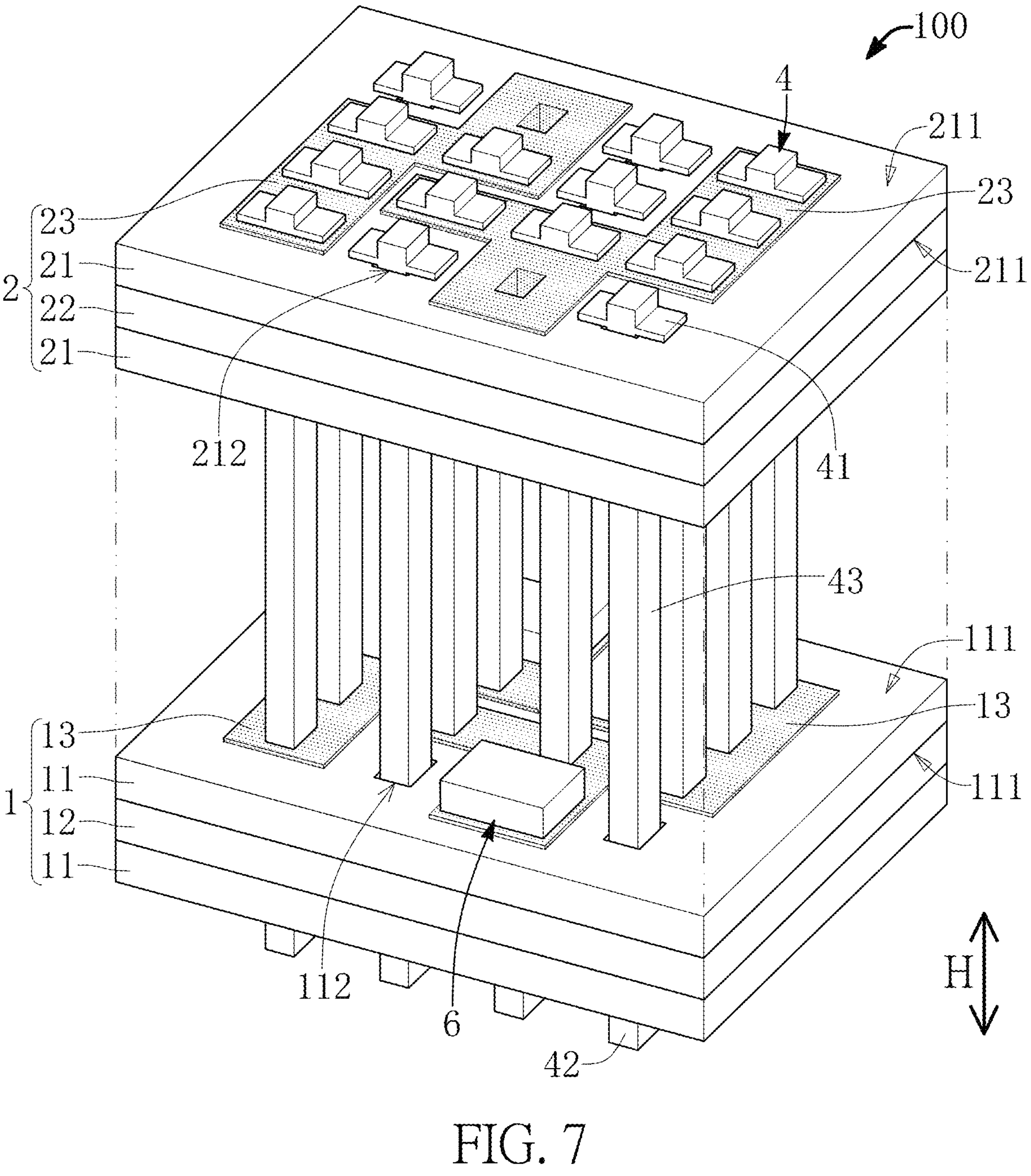
FIG. 7 is a schematic perspective view of the probe head of the probe card device according to a third embodiment of the present disclosure.
Figure 8:
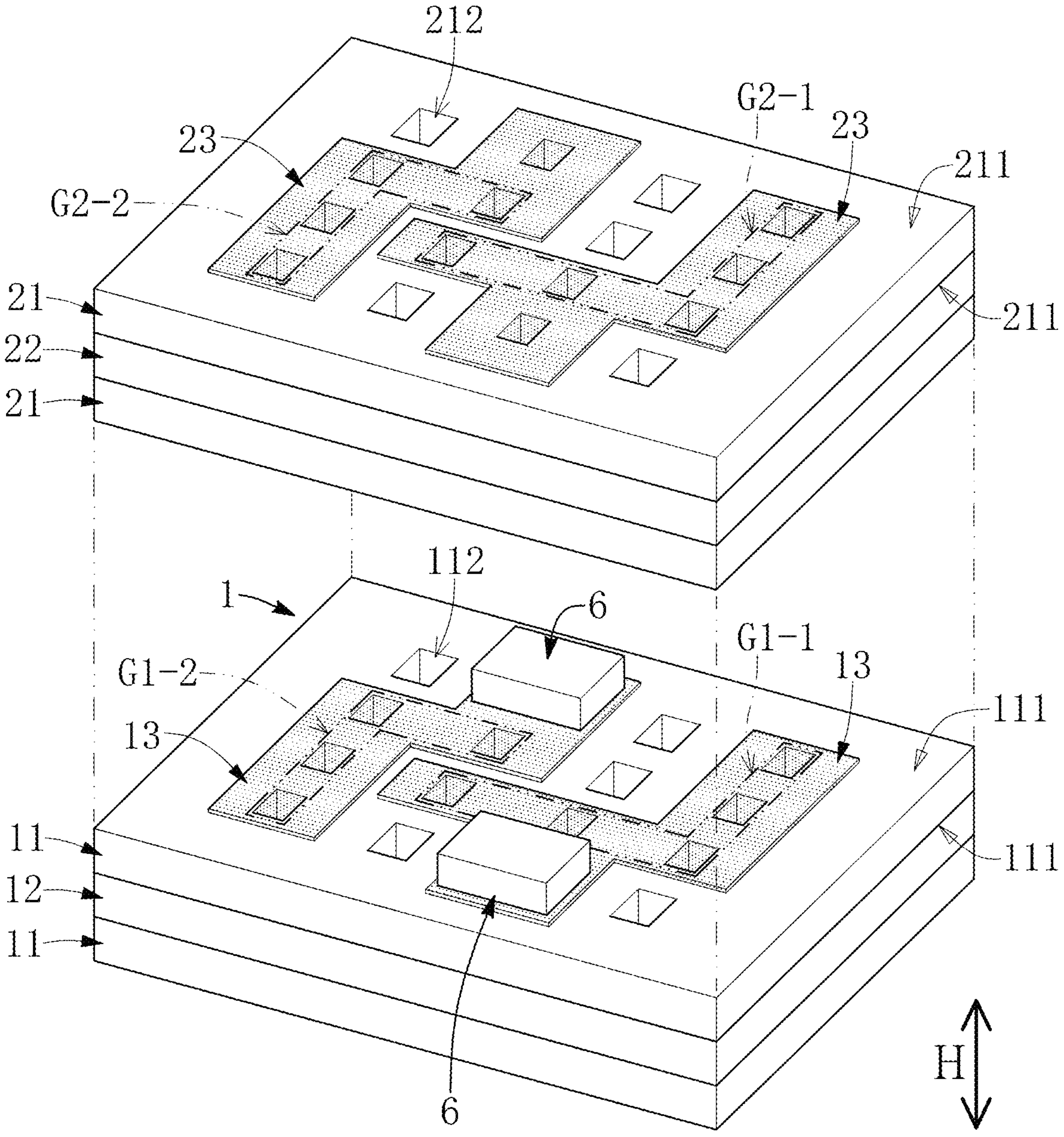
FIG. 8 is a schematic perspective view showing the guide board mechanism of FIG. 7.

Referring to FIG. 7 and FIG. 8, a third embodiment of the present disclosure, which is similar to the first and second embodiments of the present disclosure, is provided. For the sake of brevity, descriptions of the same components in the first to third embodiments of the present disclosure will be omitted herein, and the following description only discloses different features among the first to third embodiments.

In the present embodiment, the probe card device 1000 further includes at least one electronic component 6 (e.g., a passive component). In order to clearly describe the present embodiment, a quantity of the at least one electronic component 6 is two, but the present disclosure is not limited thereto. Moreover, the two electronic components 6 are assembled to the first guide board 11 provided with the two first connection circuits 13 formed thereon, and are electrically coupled to the two first connection circuits 13, respectively. In the present embodiment, the two electronic components 6 and the first thru-holes 112 of the corresponding first guide board 11 are jointly in a matrix arrangement, a quantity of the conductive probes 4 is equal to a quantity of the metal pads of the DUT (not shown in the drawings), and a portion of the DUT facing toward the two electronic components 6 along the thickness direction H does not have any metal pad arranged thereon.

Furthermore, according to practical requirements, at least one of the first thru-holes 112 can be not included in the first thru-hole groups G1-1, G1-2, and at least one of the second thru-holes 212 can be not included in the second thru-hole groups G2-1, G2-2, but the present disclosure is not limited thereto.

Fourth Embodiment

Figure 9:
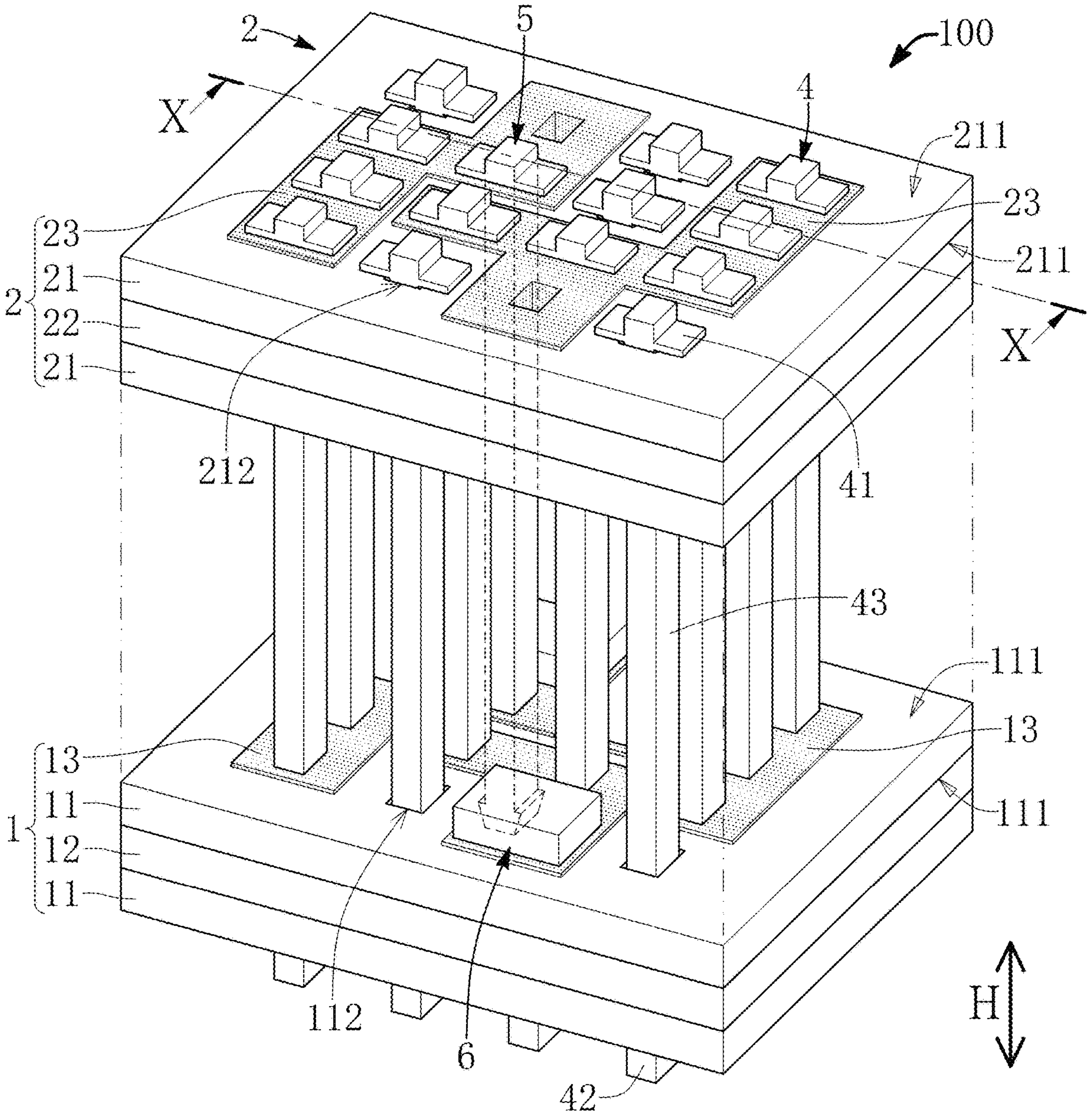
FIG. 9 is a schematic perspective view of the probe head of the probe card device according to a fourth embodiment of the present disclosure.
Figure 10:
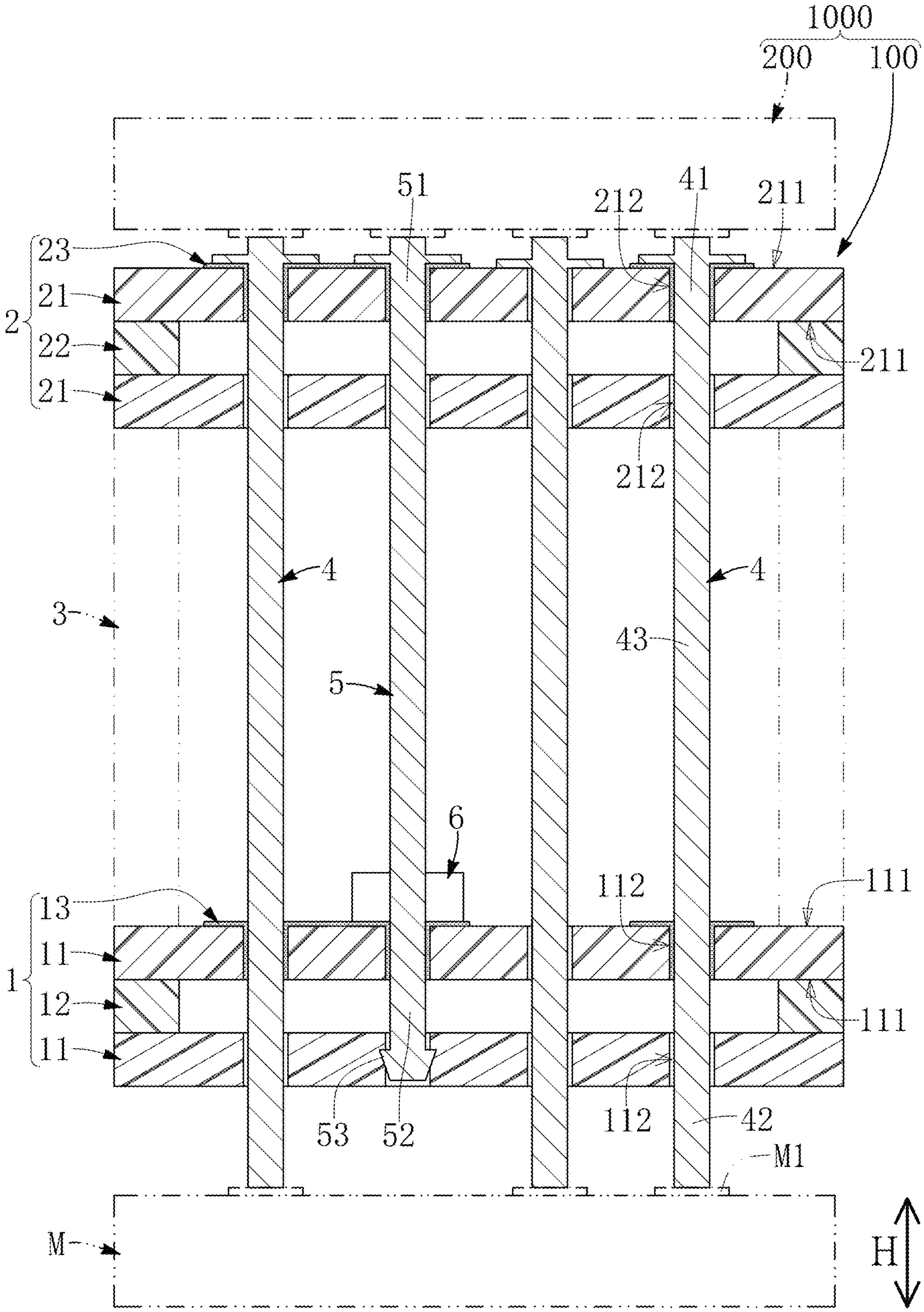
FIG. 10 is a schematic cross-sectional view taken along line X-X of FIG. 9.

Referring to FIG. 9 and FIG. 10, a fourth embodiment of the present disclosure, which is similar to the third embodiment of the present disclosure, is provided. For the sake of brevity, descriptions of the same components in the third and fourth embodiments of the present disclosure will be omitted herein, and the following description only discloses different features between the third and fourth embodiments.

In the present embodiment, the probe card device 1000 further includes at least one auxiliary probe 5 and at least one electronic component 6 (e.g., a passive component) that is electrically coupled to the at least one auxiliary probe 5. The at least one auxiliary probe 5 is assembled to the first guide board module 1 and the second guide board module 2. Moreover, in order to clearly describe the present embodiment, a quantity of the at least one auxiliary probe 5 in the present embodiment is one, and a quantity of the at least one electronic component 6 is two, but the present disclosure is not limited thereto.

The auxiliary probe 5 has a connection segment 51 and an assembling segment 52. The connection segment 51 protrudes from (or passes through) the second guide board module 2 and is fixed to the circuit board 200, the assembling segment 52 is fixed in the first guide board module 1, and the assembling segment 52 is configured to face toward the DUT M and is not in contact with the DUT M. In the present embodiment, an outer diameter of the auxiliary probe 5 is substantially equal to that of any one of the conductive probes 4, and the assembling segment 52 of the auxiliary probe 5 has at least one thorn 53 that is arranged on a free end thereof and that is fixed to one of the first thru-holes 112 of another one of the two first guide boards 11 that is provided without the two first connection circuits 13 formed thereon.

Moreover, the two electronic components 6 are assembled to the first guide board 11 provided with the first connection circuits 13 formed thereon, and one of the two electronic components 6 is electrically coupled to the auxiliary probe 5 by being connected to one of the first connection circuits 13. In the present embodiment, the two electronic components 6 and the first thru-holes 112 of the corresponding first guide board 11 are jointly in a matrix arrangement, a quantity of the conductive probes 4 is equal to a quantity of the metal pads M1 of the DUT M, and a portion of the DUT M facing toward the auxiliary probe 5 and the two electronic components 6 along the thickness direction H does not have any metal pad M1 arranged thereon.

Beneficial Effects of the Embodiments

In conclusion, the first guide board module and the second guide board module of the probe card device in the present disclosure are respectively provided with the at least two first connection circuits and the at least two second connection circuits, in which the patterns of the at least two first connection circuits are respectively identical to the patterns of the at least two second connection circuits, so that more efficient planning can be provided for a circuit path of the conductive probes for effectively increasing the performance of the probe card device and reducing a probability that components of the probe card device are damaged.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card device having a parallel connection configuration, comprising:

a first guide board module including:

two first guide boards each having a plurality of first thru-holes that are defined into at least two first thru-hole groups;

a first spacing sheet sandwiched between the two first guide boards along a thickness direction; and at least two first connection circuits formed on one of the two first guide boards, wherein the at least two first connection circuits respectively correspond in position to the at least two first thru-hole groups and are respectively arranged along the at least two first thru-hole groups;

a second guide board module being spaced apart from the first guide board module along the thickness direction and including:

two second guide boards each having a plurality of second thru-holes that are defined into at least two second thru-hole groups, wherein the at least two first thru-hole groups respectively correspond in position to the at least two second thru-hole groups, and arrangements of the at least two first thru-hole groups are respectively identical to arrangements of the at least two second thru-hole groups;

a second spacing sheet sandwiched between the two second guide boards along the thickness direction; and at least two second connection circuits formed on one of the two second guide boards, wherein the at least two second connection circuits respectively correspond in position to the at least two second thru-hole groups and are respectively arranged along the at least two second thru-hole groups, and wherein the at least two first connection circuits respectively correspond in position to the at least two second connection circuits, and patterns of the at least two first connection circuits are respectively identical to patterns of the at least two second connection circuits; and a plurality of conductive probes assembled to the first guide board module and the second guide board module, wherein the conductive probes respectively pass through the first thru-holes of each of the two first guide boards and respectively pass through the second thru-holes of each of the two second guide boards;

wherein at least two of the conductive probes passing through one of the at least two first thru-hole groups and the corresponding second thru-hole group are electrically coupled to each other by being in contact with the corresponding first connection circuit and the corresponding second connection circuit, thereby jointly establishing a parallel connection configuration in a three-dimensional mesh shape.

2. The probe card device according to claim 1, wherein the at least two first connection circuits are not connected to each other, and the at least two second connection circuits are not connected to each other.

3. The probe card device according to claim 1, wherein the one of the two first guide boards provided with the at least two first connection circuits formed thereon is located closer to the second guide board module than another one of the two first guide boards, and wherein the one of the two second guide boards provided with the at least two second connection circuits formed thereon is located further away from the first guide board module than another one of the two second guide boards.

4. The probe card device according to claim 3, further comprising:

a spacer sandwiched between the first guide board module and the second guide board module; and at least one electronic component connected to at least one of the at least two first connection circuits, wherein, in the one of the two first guide boards provided with the at least two first connection circuits formed thereon, the at least one of the electronic component and the first thru-holes are jointly in a matrix arrangement.

5. The probe card device according to claim 1, wherein a quantity of the at least two first thru-hole groups, a quantity of the at least two second thru-hole groups, a quantity of the at least two first connection circuits, and a quantity of the at least two second connection circuits are each four, and wherein the conductive probes include a plurality of grounding probes and a plurality of power probes, the grounding probes pass through two of the four first thru-hole groups and the corresponding two second thru-hole groups, and the power probes pass through another two of the four first thru-hole groups and the corresponding two second thru-hole groups.

6. The probe card device according to claim 5, wherein the grounding probes are respectively connected to two of the four first connection circuits, and are respectively connected to two of the four second connection circuits, wherein the first guide board module further includes a first bridging circuit, and the two of the four first connection circuits connected to the grounding probes are electrically coupled to each other through the first bridging circuit, and wherein the second guide board module further includes a second bridging circuit, and the two of the four second connection circuits connected to the grounding probes are electrically coupled to each other through the second bridging circuit.

7. The probe card device according to claim 1, further comprising:

a circuit board arranged adjacent to the second guide board module, wherein each of the conductive probes has a fixing segment and a testing segment that are respectively arranged on two opposite sides thereof, and wherein, in each of the conductive probes, the fixing segment protrudes from the second guide board module and is fixed to the circuit board, and the testing segment protrudes from the first guide board module and is configured to detachably abut against one of metal pads of a device under test (DUT); and at least one auxiliary probe assembled to the first guide board module and the second guide board module, wherein the at least one auxiliary probe has a connection segment and an assembling segment, and wherein the connection segment protrudes from the second guide board module and is fixed to the circuit board, the assembling segment is fixed in the first guide board module, and the assembling segment is configured to face toward the DUT and is not in contact with the DUT.

8. The probe card device according to claim 7, wherein the at least one auxiliary probe has at least one thorn that is arranged on a free end thereof and that is fixed to one of the first thru-holes of another one of the two first guide boards being provided without the two first connection circuits formed thereon.

9. A guide board mechanism of a probe card device having a parallel connection configuration, the guide board mechanism comprising:

a first guide board module including:

two first guide boards each having a plurality of first thru-holes that are defined into at least two first thru-hole groups;

a first spacing sheet sandwiched between the two first guide boards along a thickness direction; and at least two first connection circuits formed on one of the two first guide boards, wherein the at least two first connection circuits respectively correspond in position to the at least two first thru-hole groups and are respectively arranged along the at least two first thru-hole groups; and a second guide board module being spaced apart from the first guide board module along the thickness direction and including:

two second guide boards each having a plurality of second thru-holes that are defined into at least two second thru-hole groups, wherein the at least two first thru-hole groups respectively correspond in position to the at least two second thru-hole groups, and arrangements of the at least two first thru-hole groups are respectively identical to arrangements of the at least two second thru-hole groups;

a second spacing sheet sandwiched between the two second guide boards along the thickness direction; and at least two second connection circuits formed on one of the two second guide boards, wherein the at least two second connection circuits respectively correspond in position to the at least two second thru-hole groups and are respectively arranged along the at least two second thru-hole groups, and wherein the at least two first connection circuits respectively correspond in position to the at least two second connection circuits, and patterns of the at least two first connection circuits are respectively identical to patterns of the at least two second connection circuits, wherein one of the at least two first thru-hole groups and the corresponding first connection circuit surround an outer side of another one of the at least two first thru-hole groups and the corresponding first connection circuit, and one of the at least two second thru-hole groups and the corresponding second connection circuit surround an outer side of another one of the at least two second thru-hole groups and the corresponding second connection circuit.

* * * * *